United States Patent [19]
Gusakov

[11] Patent Number: 5,451,852
[45] Date of Patent: Sep. 19, 1995

[54] CONTROL SYSTEM HAVING SIGNAL TRACKING WINDOW FILTERS

[76] Inventor: Ignaty Gusakov, 1361 Underhill Rd., East Aurora, N.Y. 14052

[21] Appl. No.: 100,860

[22] Filed: Aug. 2, 1993

[51] Int. Cl.⁶ .............................................. H03H 7/12
[52] U.S. Cl. ..................... 318/611; 318/619; 364/572; 364/574; 455/306; 327/311; 327/552; 327/556
[58] Field of Search ............... 307/520, 521, 542, 543, 307/549–551; 328/167; 364/158, 572, 574, 724.01, 724.19; 318/619, 611, 807, 808, 447; 455/307, 306; 333/187, 168, 174

[56] References Cited

U.S. PATENT DOCUMENTS

| | | | |
|---|---|---|---|
| 3,814,199 | 9/1974 | Jones | 318/587 X |
| 3,889,108 | 6/1975 | Cantrell | 235/152 |
| 3,889,136 | 6/1975 | Mahan et al. | 407/295 |
| 4,035,734 | 7/1977 | Flormann et al. | 328/167 |
| 4,059,786 | 11/1977 | Jones et al. | 318/17 |
| 4,198,612 | 4/1980 | Morton | 333/174 X |
| 4,271,332 | 6/1981 | Anderson | 381/36 |
| 4,302,738 | 11/1981 | Cabot et al. | 333/174 |
| 4,313,074 | 1/1982 | Nomura et al. | 318/608 |
| 4,322,641 | 3/1982 | Packard | 307/521 |
| 4,415,049 | 11/1983 | Wereb | 318/269 X |
| 4,636,700 | 1/1987 | Moore et al. | 318/611 |
| 4,749,951 | 6/1988 | Tanaka | 328/167 |
| 4,931,743 | 6/1990 | Fukuda et al. | 328/167 |
| 4,954,732 | 9/1990 | Surauer et al. | 307/520 |
| 4,961,014 | 10/1990 | Kasahara | 307/520 |
| 5,001,374 | 3/1991 | Chang | 307/542 |
| 5,033,000 | 7/1991 | Littlejohn et al. | 364/424.05 |
| 5,323,337 | 6/1994 | Wilson et al. | 364/574 |

Primary Examiner—William M. Shoop, Jr.
Assistant Examiner—Brian Sircus
Attorney, Agent, or Firm—Jim Zegeer

[57] ABSTRACT

A control system having a source of control signals and a multi-window electrical signal tracking filter. The signal tracking filter includes an operational amplifier operating in the non-inverting mode as a high impedance load, with a plurality of input stages cascaded at the input to the operational amplifier, each input stage having both a frequency determining filter portion and an amplitude determining threshold detecting portion. Each input stage defines a "window" of operation, such that the portion of a control signal or the like inputted to the filter which falls within the "window" will be filtered or attenuated thereby, while the portion of the control signal which falls outside of the "window" will pass unaffected through the filter. Cascading of the input stages allows one to customize the portions of the signal to be filtered for any particular application.

10 Claims, 6 Drawing Sheets

CONTROL SYSTEM HAVING SIGNAL TRACKING WINDOW FILTERS

BACKGROUND OF THE INVENTION

1. Field of the Invention

The present invention relates to a control system housing an electrical filter circuit to selectively filter out undesirable portions of a signal, such as noise, ripple, oscillations or vibrations occurring at frequencies within the bandwidth that the control system is expected to operate, while not affecting the large amplitude control signals present in the system.

Such a filter can be especially important in a control system such as used in a motorized wheelchair controller, wherein any tremor or spasticity occurring in an operator's hand or arm might cause erratic and potentially dangerous operation of the chair's drive motors. Controllers which respond to these tremor inputs may cause the chair to vibrate and move in undesirable ways.

2. Description of the Prior Art

Numerous attempts have been made to "soften" the operation of motorized wheelchair controllers in the past, including U.S. Pat. Nos. 4,415,049, issued Nov. 15, 1983, to John A. Wereb; 4,059,786, issued Nov. 22, 1977, to Michael Floyd Jones, et al.; and 3,814,199, issued Jun. 4, 1974, to William M. Jones. However, none has approached the problem in the same manner as the present invention. Prior attempts to filter or delay the undesirable low frequency tremor signals have compromised the response of the chair motors to inputs to the controller such that stopping or maneuvering the chair next to curbs, stairs, platforms, or vehicular or pedestrian traffic become unsafe.

In the art of electrical filters per se, adaptive filters such as those shown in U.S. Pat. Nos. 4,749,951, issued Jun. 7, 1988, to Yasushi Tanaka; 4,198,612, issued Apr. 15, 1980, to Roger R. A. Morton; and 3,889,108, issued Jun. 10, 1975, to Ben H. Cantrell represent attempts to filter an undesirable portion of the same signal, but none provides either the specific circuitry of the subject invention or the versatility of being able to cascade multiple stages of input filter circuitry to customize the control system for specific frequencies and/or amplitudes of the signals to be filtered as is possible with the present multi-window filter invention.

Other noise reducing systems and signal stripping circuits of the prior art have been noted, as shown by U.S. Pat. Nos. 4,322,641, issued Mar. 30, 1982, to Thomas N. Packard; 4,302,738, issued Nov. 24, 1981, to Richard C. Cabot et al.; and 3,889,136, issued Jun. 10, 1975, to William L. Mohan, et al., but none provides the flexibility and versatility of the present multi-window filter design in elimination of unwanted, low amplitude signal portions while passing the desired large amplitude control signals virtually unaffected.

SUMMARY OF THE INVENTION

This invention discloses a control system or a circuit including a plurality of window filters and threshold devices electrically connected so that control signals or the like passing through the circuit will be filtered to reduce or eliminate undesirable signals which otherwise would cause noise, ripple, oscillation or vibration in the control system. Filtering of such undesirable signals is effected without adversely affecting those control signals passing through the control system circuit and retaining the desired amplitude. The undesirable signals are filtered at frequencies and amplitudes specifically chosen for each individual application.

Specifically, a multi-window electrical filter is provided which includes multiple input stages which are cascaded; that is, electrically connected in series, to the non-inverting input of an operational amplifier, each stage being designed to filter out an undesired signal having a specific frequency and amplitude without affecting the remaining portion of the signal. Each input stage includes (a) a filter which removes frequencies which have been identified as unwanted and permits frequencies to pass which have been identified as desired frequencies, and (b) a threshold device which determines the amplitude of the signal to be filtered. Such amplitude and frequency characteristics identify a "window" or region for each stage within which the filter is effective on the control signal or the like. Any portion of the signal outside the "window" will be unaffected by the filter associated with the amplitude of the respective stage. The window tracks or moves with signals having large amplitude changes while filtering signals whose amplitudes are within the thresholds of the window boundaries. The present invention embodies a multi-window electrical filter wherein the filter tracks or moves with the average amplitude of the time varying signal and filtering takes place within the thresholds of the window. The cascading of the multiple input stages allows the multi-window filter to be customized to remove undesired portions of a signal as needed. Also, cascading permits tapering the amount of attenuation applied to a signal as a function of the amplitude of its variation. For example, large amplitudes can be attenuated less than small amplitudes, the larger the amplitude of variation from the average amplitude of the signal, the less the attenuation present.

In a particular embodiment, the present invention discloses a multi-window electrical filter for use in a motorized wheelchair control circuit. The filter includes an operational amplifier having inverting and non-inverting inputs and a single output. A plurality of cascaded or series connected window filter stages are connected to the non-inverting input of the amplifier. One of the input stages comprises a low frequency, low pass filter having a threshold device shunting the filter, and another of the stages comprises a low pass filter with a higher corner frequency than the previous stage and a threshold device shunting same but at a higher voltage level. The plurality of input stages is arranged to filter an input signal of any unwanted noise, ripple, oscillation and vibration as might be caused by tremor or spasticity in the hand or arm of the operator of a controller for the motorized wheelchair control circuit, with the threshold device sequentially by-passing each filter when the signal amplitude level is equal to or greater than a level set by the threshold switches, respectively, thus allowing only the average of large amplitude control signals to be sensed by the control circuit.

DESCRIPTION OF THE PREFERRED EMBODIMENT

Figure 1:
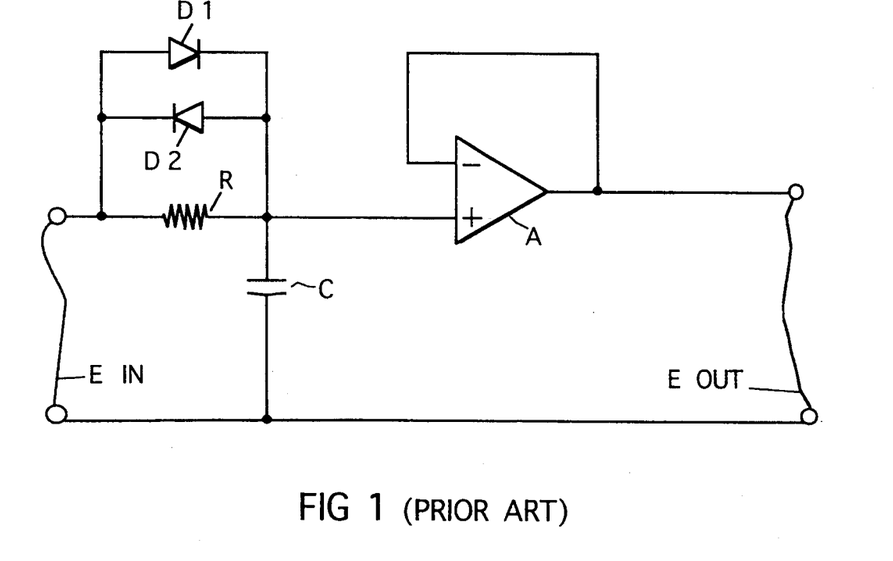
FIG. 1 is a schematic drawing of the circuit for a basic-prior art single-window filter.

In order to aid in the understanding of the operation of the multi-window filter of this invention, reference is first made to the prior art single-window filter of FIG. 1. Operational amplifier A is used to provide a high impedance load to the first order low pass filter formed by resistor R and capacitor C. Amplifier A is utilized in the non-inverting or follower configuration. The filter is of the form $$\frac{1}{1 + tS}$$

where t equals the filter time constant, which is equal to the product R C, and S equals the Laplace operator used in this form of the filter transfer function. The equation relating input voltage (E in) and output voltage (E out) is $$\frac{E \text{ out}}{E \text{ in}} = \frac{1}{1 + RCS}$$

for small amplitude signals. The window threshold signal level is determined by the forward junction voltage drops of diodes D1 and D2. The junction voltage drop for silicon diodes is approximately 0.7 volts. Zener diodes or variable reverse biased diodes may be used for applications where voltage thresholds greater or less than 0.7 volts are needed. The reverse parallel combination of diodes D1, D2 will conduct for voltage drops greater than ±0.7 volts. These voltages will appear unfiltered at the positive input of amplifier A, while voltages within this window (±0.7 v.) will be filtered, attenuated or suppressed.

Figure 2A:
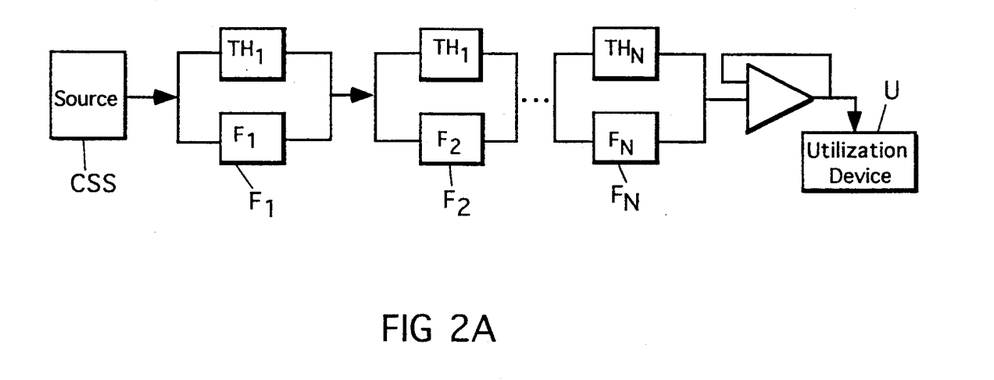
FIG. 2A is a block diagram of a control system incorporating the invention.

In its broadest aspect, the present invention relates to a multi-window electrical filter as depicted in the control system shown in FIG. 2A. Such circuit will selectively filter out unwanted portions of a signal, such as noise, ripple, oscillations and vibrations. As shown in FIG. 2A, a signal source CSS provides an input control signal to a cascaded chain of filter circuits $F_1, F_2 \ldots F_N$ which supplies a filtered output control signal to the non-inverting input of operation amplifier OP AMP, which has its output connected to its inverting input and to a utilization device C such as a motor controller U. Each filter stage has a voltage threshold switching device $TH_1, TH_2 \ldots TH_N$ connected in parallel or bypassing relation to its respective filter $F_1, F_2 \ldots F_N$. Each succeeding threshold device responds to a succeedingly larger threshold voltage. Preferably, the voltage threshold switching devices are bi-directional.

Figure 2B:
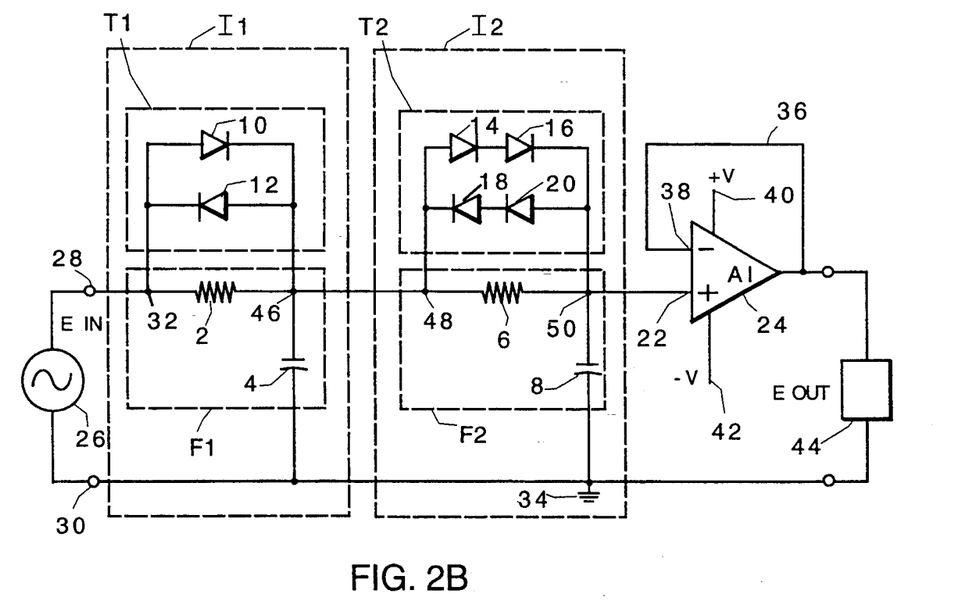
FIG. 2B is a schematic drawing of a circuit for a multi-window filter in accordance with the invention.

As shown in FIG. 2B, a plurality of series connected input stages is provided including a first input stage I1 and at least one subsequent input stage I2, each input stage having an input and an output. The input of input stage I1 is connectable to the control signal to be processed (E in). One of the subsequent input stages is a last input stage. The output of such last input stage is electrically connected to the non-inverting input of operational amplifier AI. Each input of each subsequent input stage is electrically connected to the output of a preceding input stage. Each respective input stage includes first means F1, F2 electrically connected between the input and output of such respective input stage for filtering out unwanted frequencies of the signal while permitting desired frequencies of the signal to pass through the first means to the output of such respective input stage, and second means T1, T2 electrically connected to the first means for providing a voltage threshold which permits current flow, of the signal having voltages with amplitudes that are less than the voltage threshold, through the first means and to the output of such respective input stage, and which permits current flow, of the signals to be processed having voltages with amplitudes that are equal to or greater than the voltage threshold, through the second means and to the output of such respective input stage.

Although FIG. 2B depicts a two-window filter, that is, a multi-window electrical filter having two input stages I1 and I2, as shown in FIG. 2A, it will be apparent to those skilled in the art that there is no theoretical limit to the numbers of windows or input stages which may be added to such a circuit. For example, if desired, an additional subsequent input stage I3 depicted in FIG. 2C can be provided as described herein.

In the embodiment of FIG. 2B each first means F1, F2 is a filter. Filter F1 includes resistor 2 and capacitor 4 and filter F2 includes resistor 5 and capacitor 8. Although each such filter is a first order filter, it will be obvious to one skilled in the art that other types of filters can be used. For example, second order, notch, Butterworth, Chebychev and Bessel are examples of other forms of filters F1, F2 which may be used with similar results. In the embodiment of FIG. 2, each second means T1, T2 is a threshold device. In the embodiment depicted in FIG. 2, threshold device T1 includes silicon diodes 10 and 12 and threshold device T2 includes silicon diodes 14, 16, 18 and 20. Although each such threshold device includes silicon diodes, it will be obvious to one skilled in the art that other threshold devices can be used. For example, voltage threshold detectors, FET signal switches and reverse biased diodes are examples of other forms of threshold devices T1, T2 which may be used with similar results. In more complex situations, the threshold devices can be controlled to change the various threshold levels. It will be apparent to one skilled in the art that the selection of component parameters and discrete values or types will depend upon the nature of the signals to be processed. For example, as to the threshold devices T1, T2, switching thresholds will be determined by the amplitudes of the signals in need of filtering. As to the filters F1, F2, filter frequencies will be dependent upon the frequency content of the signals to be filtered.

In the embodiment, the filter F1 is formed by the combination of resistor 2 and capacitor 4 which are electrically connected together in series to form a first order filter the time constant of which is determined by the product of the value of the resistance of resistor 2 and the capacitance of capacitor 4. The filter F2 is formed by the combination of resistor 6 and capacitor 8 which are electrically connected together in series to form a first order filter the time constant of which is determined by the product of the value of the resistance of resistor 6 and the capacitance of capacitor 8. As depicted in FIG. 2, filter F2 is electrically connected in cascade or series with filter F1 and to the non-inverting (+) input 22 of an operational amplifier 24. The signal to be processed is in the form of a voltage input which is produced by signal source 26 and applied to the terminals 28, 30 (E in). Terminal 28 is electrically connected to the resistor 2 and diodes 10, 12 through junction 32. Junction 32 constitutes the electrical input to, and junction 46 constitutes the electrical input of, the input stage I1. Terminal 30 is electrically connected to the circuit common or ground 34. The circuit of the filters F1, F2 is completed by electrically connecting the output of capacitors 4 and 8 to the circuit common or ground 34.

The operational amplifier 24 is used as a voltage follower which means that the output of the amplifier will exhibit the same signal voltage that exists at the non-inverting input 22. The output of the amplifier 24 is connected by conductor 36 to the inverting input (−) 38 of the amplifier 24. Direct current voltage connections are made to the amplifier at 40(+v) and 42(−v) to provide power to the amplifier. The voltage follower circuit provided in this manner is well known in the prior art and is used in the embodiment of FIG. 2 because a very high impedance exists at the non-inverting input 22 of the amplifier 24 which means that the RC filter network will not be loaded by the circuit connected to its output. The voltage output of the amplifier 24 is electrically connected to the load 44 developing a voltage (E out) across the load from the output of the amplifier to the circuit common or ground 34.

The threshold devices serve as switches which direct signal current to flow either through a filter or around it in a bypass manner as described hereafter. In the embodiment of FIG. 2B, the threshold device T1 includes diodes 10 and 12 which are electrically connected in reverse parallel by which is meant that the diodes are connected in parallel, and the cathode of one diode is connected to the anode of the other diode. Such a parallel diode combination is connected across the resistor 2 at junctions 32 and 46. The threshold device T2 includes a first network including diodes 14 and 16 which are connected in series and a second network including diodes 18 and 20 which are also connected in series. The two networks are connected in reverse parallel, a cathode of one of the diodes of one network being connected to an anode of one of the diodes of the other network. The two networks of diodes which form the threshold device T2 are connected across the resistor 6 at junctions 48 and 50. Junction 48 constitutes the electrical input to, and junction 50 constitutes the electrical output of, the input stage I2.

In the embodiment of FIG. 2B, silicon diodes are selected so that in the forward conduction direction, the diodes 10, 12 will not permit the flow of current until the voltage across the diodes exceeds 0.7 volts. For opposite polarities of voltage, such diodes will block current flow. When two silicon diodes are connected in series such as diodes 14 and 16, such diodes will not permit the forward conduction of current until the voltage across the series combination is 1.4 volts. Such diodes also serve to block current flow for opposite polarities of voltage. In this manner, the diodes 10 to 20 control the threshold voltage at which signal current will flow through a filter F1, F2 or bypass a filter entirely as explained in greater detail herein.

In the operation of the embodiment of FIG. 2, if the change in input signal voltage at terminals 28, 30 is below ±0.7 volts, all of the signal current will flow through filter F1 and filter F2. In this manner, signals below ±0.7 volts will be filtered by the two filters (F1, F2) in cascade or series and thereby be subjected to the maximum filter effect. If the input signal voltage change at terminals 28, 30 is between ±0.7 and ±1.4 volts, and produces an equivalent voltage change across resistor 2, signal current will bypass filter F1 by flowing through diodes 10, 12 and into the second stage filter F2. In essence, the diodes of threshold device T2 block current flow therethrough so that current will flow through filter F2. In this manner, only the second filter stage provided by filter f2 is functional when the input voltage change is in the range of ±0.7 to ±1.4 volts. Finally, if the input signal voltage change at terminals 28, 30 is above ±1.4 volts, and produces an equivalent voltage change across resistor 6, the signal current will flow directly to the follower or non-inverting input 22 of the operational amplifier 24; that is, the signal current will bypass filters F1 and F2, flowing directly through threshold devices T1 and T2 to the input 22.

The time constant or bandwidth of filters F1 and F2 can be the same or different. For example, the time constant of filter F1 can be chosen to be larger than that of filter F2 so as to enable the signal that is within the smaller threshold levels to be attenuated or filtered more than signals whose amplitudes cause them to pass through the larger threshold window.

Figure 2C:
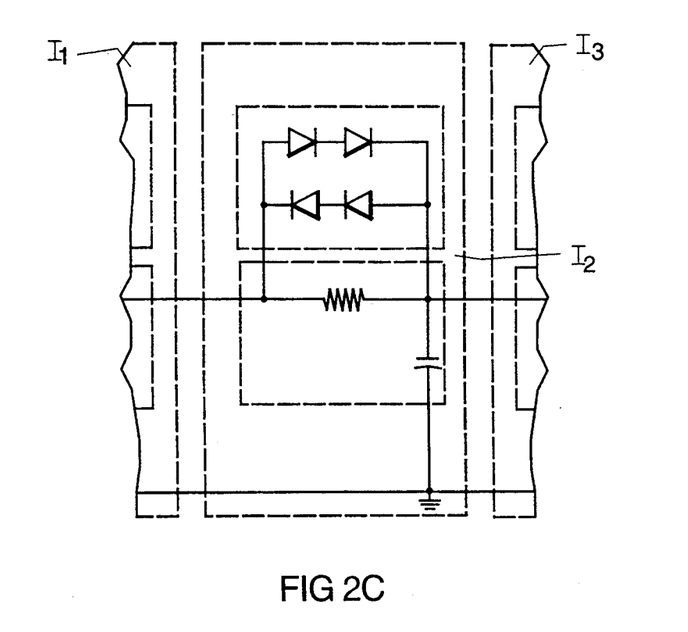
FIG. 2C is a schematic drawing of a portion of a circuit for an alternate embodiment of the present invention.
Figure 3:
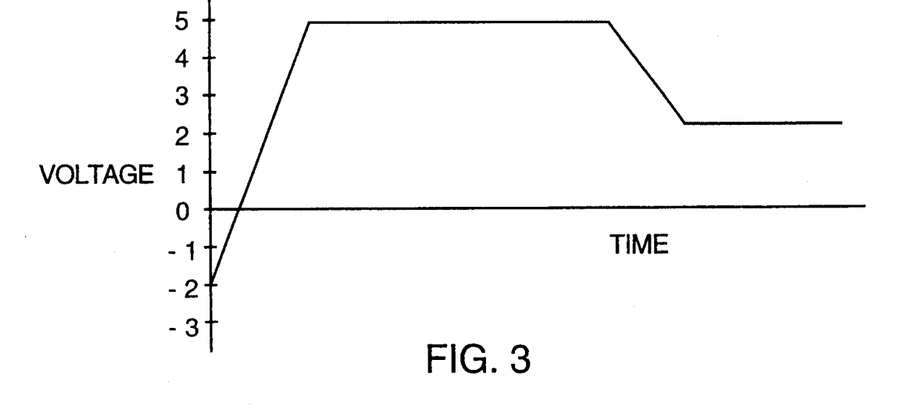
FIG. 3 depicts desired or optimal voltage change with time.
Figure 4:
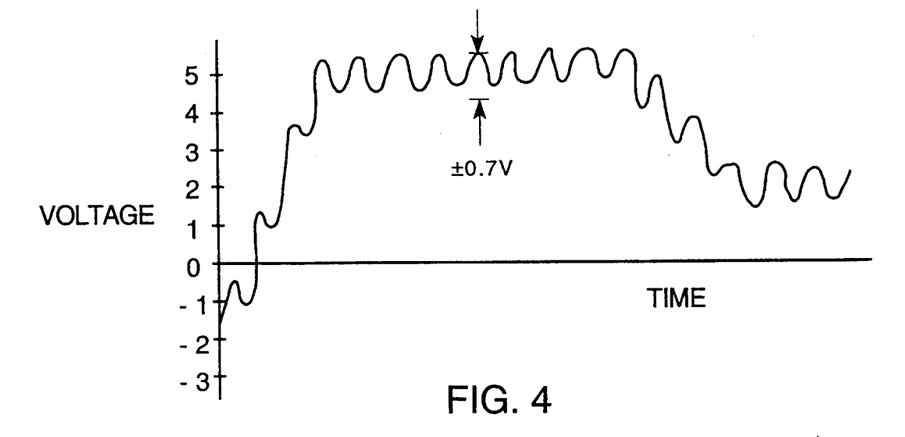
FIG. 4 depicts the actual unfiltered signal voltage change with time.
Figure 5:
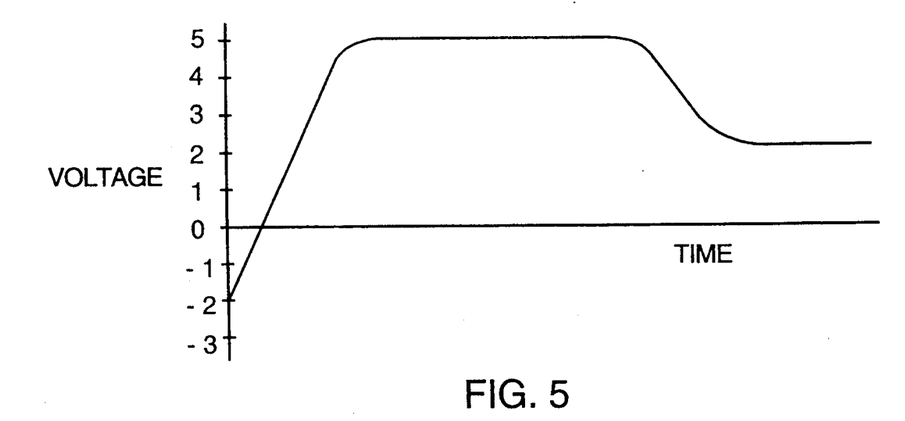
FIG. 5 depicts the actual filtered signal voltage change with time using a window filter.

FIG. 3 represents the shape of the voltage and time relationship representing a desired input voltage, i.e., an ideal time varying waveform signal independent of any connection, hardware or processing. FIG. 4 shows what the actual existing waveform looks like with noise, ripple or other time varying voltage content. This view represents the actual input voltage, E in, which contains the desired signal, with undesired ripple or oscillation present, which the circuit of FIG. 2 will process. By passing the actual signal through the circuit of FIG. 2, the filtered output voltage, E out, as depicted in FIG. 5 is obtained.

One possible use for the multi-window filter of FIGS. 2A, B and C is in conjunction with a joystick controller for a motorized wheelchair. As often happens, the wheelchair patient may suffer from tremor or uncontrollable vibration or spasticity in his hand or arm, making smooth operation of the joystick controller and the chair very difficult. Controllers which respond to these tremor inputs may cause the chair to vibrate or move in undesirable ways. The multi-window filter provides a means for filtering the low amplitude signals generated by joystick movement due to tremor while not affecting the larger amplitude control signals. For this particular application, the filter F1 might be a first low pass filter and the filter F2 might be a second low pass filter, respectively, the second low pass filter having a higher frequency than that of the first low pass filter.

Figure 6:
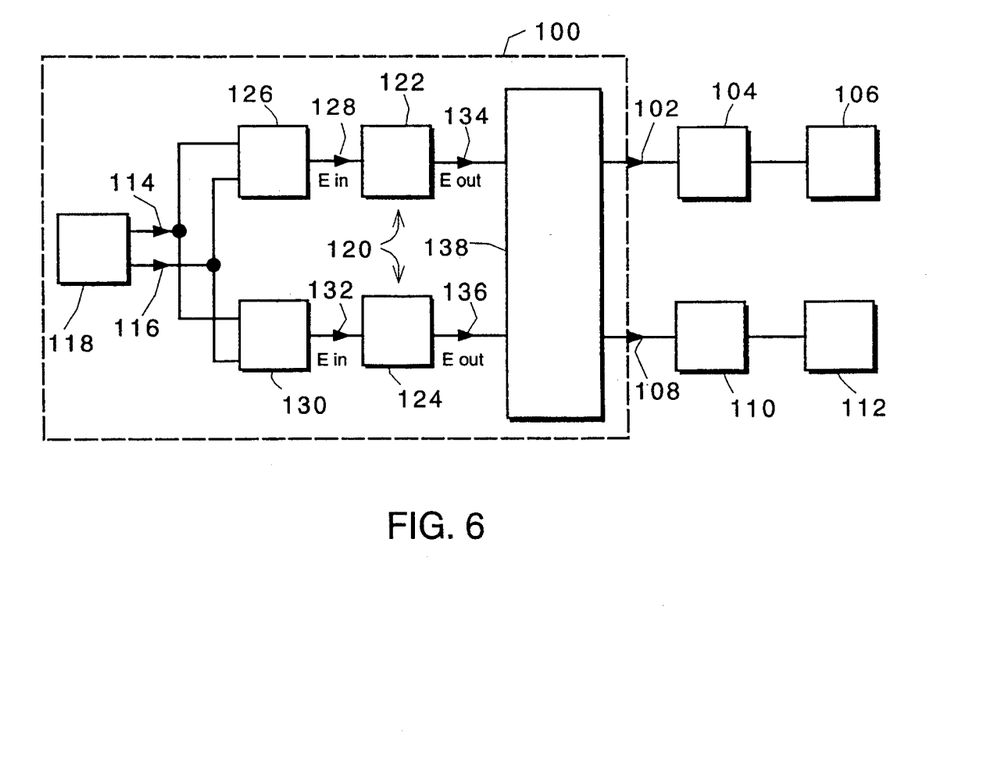
FIG. 6 is a block diagram of a motorized control circuit which produces command signals to drive motors for drive wheels of a wheelchair and includes the multi-window filter of the present invention.
Figure 9:
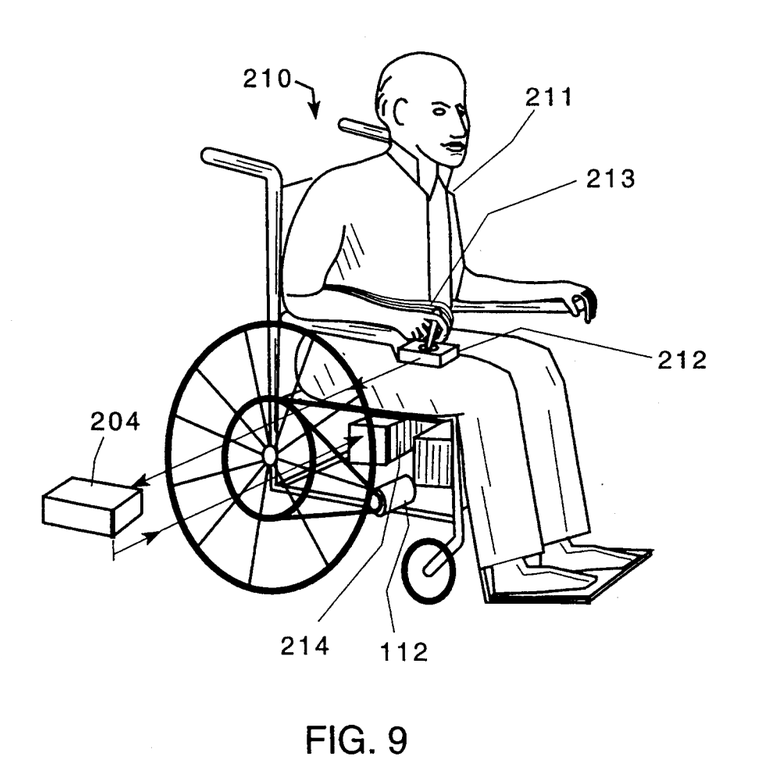
FIG. 9 illustrates the invention combined with a wheelchair controller.

Referring to FIGS. 6 and 9, operation of the multi-window filter circuit of FIGS. 2A, B or C will now be described as it would apply to a motorized wheelchair control circuit. Since a joystick controller has four normal quadrants of operation, forward, backward, left, and right, four of the circuits of FIGS. 2A, B or C could be employed, one for each quadrant of operation. Since most control signals are bipolar, however, it is possible to use two of such circuits, as depicted in FIG. 6, instead of four. One would be used for fore and aft operation and one would be used for left and right operation.

FIG. 9 shows the powered wheelchair 210 wherein a patient 211 sits in the wheelchair and operates a joystick 212 (element 118 in FIG. 6) to initiate direction and speed of movement. If the patient has spasticity or erratic hand shaking 204, these tremor-like hand movements will command the wheelchair 210 to move in a like or erratic manner. If the joystick electrical output signal is filtered with a window filter 204 before passing it on to the power controller 214, the effect of spasticity of hand tremor can be eliminated or greatly attenuated. However, if it is necessary for the patient to stop or make a directional change quickly, the corresponding large amplitude corrective input command from the patient's hand movement will be passed from the joystick 212 to the power controller 214 virtually unattenuated. Such response is required in emergency operation. In contrast, with conventional filtering intended to attenuate spastic inputs, response to emergency input signals would be attenuated, as well as the spasticity effects.

In the circuit of FIG. 6, the motorized wheelchair control circuit 100 produces command signals 102 to a first drive motor 104 which is mechanically connected to a first wheelchair wheel 106 and command signals 108 to a second drive motor 110 which is mechanically connected to a second wheelchair wheel 112 in response to output signals 114 and 116 produced by at least one joystick controller 118. Multiple window filter means 120 is electronically connected between the joystick controller 118, on the one hand, and the drive motors 104, 110, on the other hand, for selectively filtering out unwanted portions of the output signals 114, 116, such as noise, ripple, oscillations and vibrations. Multiple window filter 120 includes a first multi-window electrical filter 122 and a second multi-window electrical filter 124, each of which includes the circuitry, and operates in the manner of FIG. 2.

Joystick 118 is a prior art-type joystick which comprises two transducers such as, for example, electrical potentiometers, inductive transducers, and the like. The two transducers typically are connected to a joystick lever which can be displaced forward or backward while in a centered position relative to any lateral disposition, and can be displaced to the right or to the left relative to such centered position. Movement of the lever in a forward direction relative to neutral produces a positive voltage, and movement of the lever in a rearward direction relative to neutral produces a negative voltage. Such voltage is in the form of output signals 114, 116 which will be equal. Such output signals are summed by a summer 126, the resultant signal 128 representing a command for forward or reverse movement of motors 104, 110, each motor moving in the same direction and with the same speed, to cause forward or backward movement of wheels 106, 112, in a known manner, depending upon whether the joystick lever is moved forward or backward. Movement of the lever to the right or left of its centered position while the lever is in the forward or backward position produces a positive voltage or a negative voltage, respectively. Such voltage in the form of output signals 114, 116 will be unequal and will be directed to summer 130 which will produce a difference signal identified as resultant signal 132. Resultant signal 132 will represent a command for forward or reverse movement of the motors 104, 110, each motor moving in the same direction but with different speeds to cause rightward or leftward movement of the wheelchair, in a known manner, depending upon whether the joystick lever is moved to the right or to the left, respectively.

The resultant signal 128 is fed to the multi-window electrical filter 122 and the resultant signal 132 is fed to the multi-window electrical filter 124. Resultant signals 128 and 132 are filtered by the multi-window electrical filters 122 and 124, respectively, which function in the same manner as discussed above regarding the circuit of FIG. 2. The multi-window electrical filters 122 and 124 produce command signals 134 and 136, respectively, which are fed to a two channel power controller 138 which applies modulated power through command signals 102 and 108 to motors 104 and 110, respectively. The two channel power controller 138 will include the source of power such as a battery (not shown) to energize the control circuit 100 and motors 104 and 110 in a known manner.

In operation, when the joystick lever is moved forward or backward, relative to its neutral position, the drive motors 104, 110 will rotate together with the same speed in the forward or backward direction, respectively, thereby moving the wheelchair in such direction. If in combination with such forward or backward level displacement, right or left level movement is also introduced, the wheelchair will move right or left, respectively, while moving forward or backward, as a result of having one drive motor rotating faster than the other.

Considering a normal voltage command range of wheelchair operation of 0–5 volts from rest to full motor speed, the effects of patient tremor may be assumed to be in the range of 0–1.4 volts. In considering FIG. 4, the ripple in the curve may be caused by such tremor. Utilizing the circuit of FIG. 2, a change in the tremor signal of 0–1.4 volts may be filtered out with the two-window electrical filter depicted, leaving voltage changes outside of this range unfiltered.

By using a two-window electrical filter according to this invention, small amplitude signals that are less than ±0.7 volts from the average of the desired signal are attenuated more than larger amplitude signals that have amplitudes between ±0.7 to ±1.4 volts. If a corner frequency that is 0.1 of the ripple frequency is used, very high attenuation results within the windows as shown in FIG. 5. Small amounts of rounding of the signal are evident at points where signal changes are very abrupt. The window filter tracks the average amplitude of the time varying signal and filters within a window that moves with this average amplitude.

The first window filter I1 formed by filter F1 and threshold device T1 is set by selecting the proper resistor 2 and capacitor 4 to filter out low frequency, low threshold (0±0.7 volt) tremors such as might occur when the patient is simply resting his hand on the controller in preparation for inputting a signal to cause the chair to move or hanging onto the control in trying to move at a constant speed. Referring to FIGS. 2 and 6, a tremor signal of less than ±0.7 volts would appear at 128, 132, and the combination of resistor 2, capacitor 4 and the silicon diodes 10 and 12 would filter the signal and block its passage to the positive input of amplifier 24. If, upon applying pressure to the joystick controller, the signal voltage amplitude change should increase above ±0.7 volts but less than ±1.4 volts, the second window filter formed by resistor 6, capacitor 8, and diodes 14 to 20 may be adjusted to react at a higher frequency by choosing appropriate values for resistor 6 and capacitor 8, while the dual silicon diodes 14, 16, 18, 20 will act to filter the voltage input change from ±0.7 to ±1.4 volts. Thus, only signal changes from the controller greater than ±1.4 volts from the steady state value will reach the input 22 of amplifier 24 and the E out terminals from which they are then sent in an unfiltered condition to the two channel power controller 138 and motors 104, 110 as described herein.

The most significant use of window filters, according to the invention, is in applications where a servosystem is expected to operate responsively and in a stable fashion over a specific bandwidth or frequency response range wherein there is noise, vibration or other unwanted signal content in the system whose frequencies are within the expected bandwidth of the servosystem. Sources of these unwanted signals, among others, are: 60 Hz line noise, vibration due to spring and mass resonance with low damping, slip stick oscillation in movement wheel hop in vehicles moving over nonuniform roads, wheel runout or out of round conditions causing a once per revolution force variation and vibrations from engine or motor imbalance conditions. Electrical transducers that measure force (load cells), pressure, accelerations (accelerometers), velocity (tachometers) and position (potentiometers, LVDTs and encoders) all respond to physical motion, both desired and undesired. The unwanted signals are often dealt with by conventional filtering with the accompanying penalty of restricting the bandwidth, response and performance of the servosystems.

The multi-window filters of this invention are sensitive to signal amplitude in cascaded filter applications, the larger the signal amplitude is, the less it is filtered. Filtering takes place inside of a window or threshold that moves with changing primary signal levels as explained above.

Figure 7:
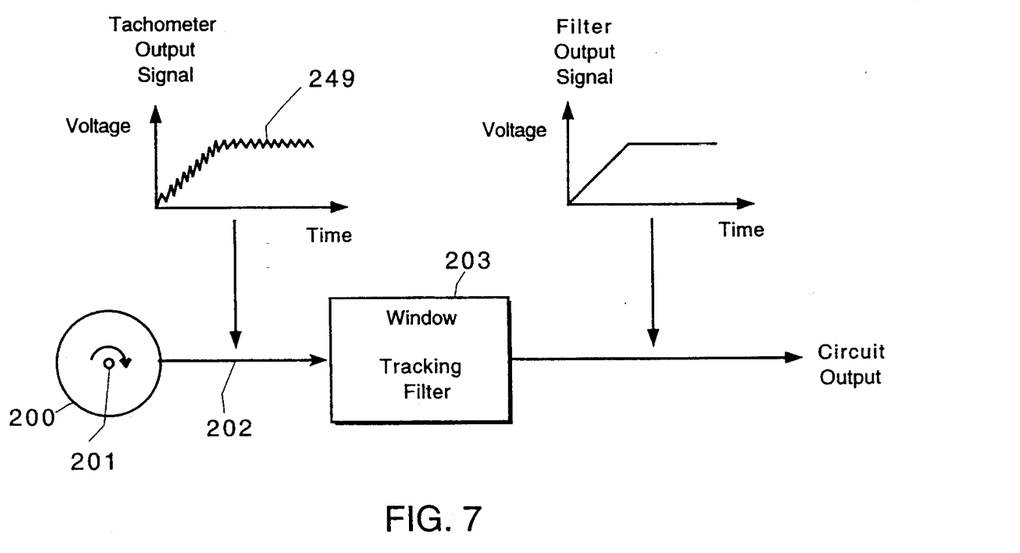
FIG. 7 is a block diagram showing how a window tracking filter incorporating the invention can be used with a D.C. tachometer to remove unwanted amplitude modulating ripple voltage (commutation ripple) from the speed signal.

In the simplest application, multi-window or amplitude tracking filters can be placed in a signal path where filtering is desired. For example, in FIG. 7 above, a signal, which could originate in a tachometer 200 where, in addition to a d.c. voltage 249 that is proportional to shaft speed 201, a noise signal or ripple 249 is present due to voltage commutation and rides on top of the d.c. voltage produced in response to the speed of the armature. Also, such a signal as in FIG. 8 could be present in an electrical circuit that produced the response shown in FIG. 7, but in addition, 60 Hz powerline a.c. is coupled through stray coupling and makes its presence known by modulating the primary desired voltage as shown in FIG. 7. The result again, is a composite, modulated signal as depicted in FIG. 7.

If a conventional filter were used, distortion of the primary signal or voltage would result in signal variation in the frequency range of the filter. If a multi-window filter were used, filtering would occur only inside of the window or established threshold, allowing large signal response to take place without filtering.

There are virtually hundreds of specific applications in which these filters could be used. The following describes a few specific examples of applications.

FIG. 7 shows a block diagram of how a multi-type window filter 203 could be used with a d.c. tachometer 200 to remove unwanted amplitude modulating ripple voltage from the speed signal on line 202.

Figure 8:
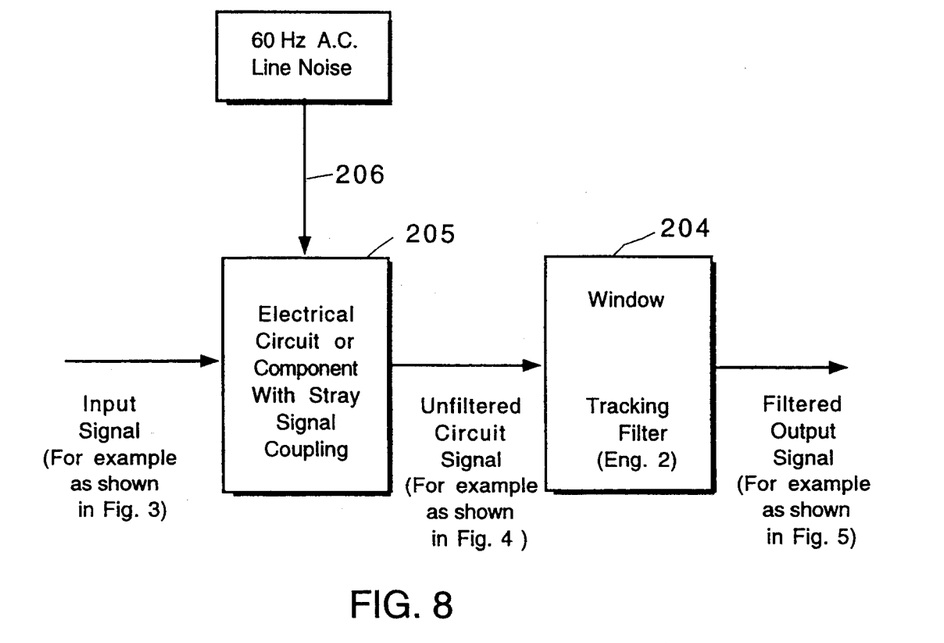
FIG. 8 is a block diagram illustrating how a window filter, according to this invention, can be used to remove 60 HZ line noise from a circuit.

FIG. 8 shows a block diagram of how a multi-window filter 204 could be used to remove 60 Hz line noise 206 from a circuit where it is present through stray inductive or capacitive coupling.

Figure 10:
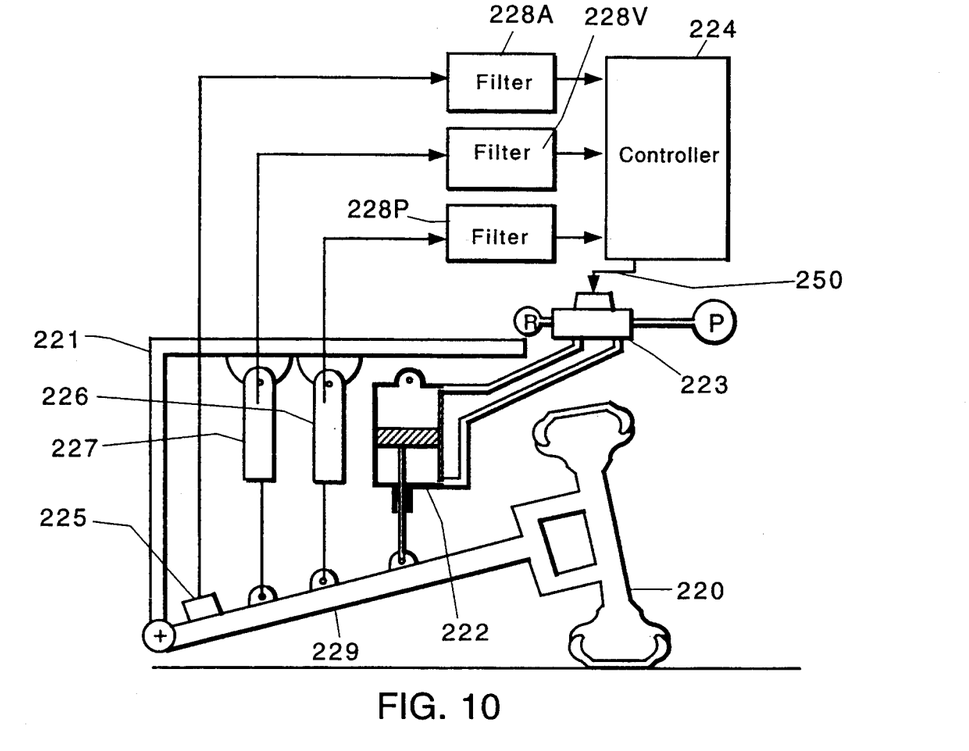
FIG. 10 is a schematic and block diagram of an active vehicle suspension system, using window tracking filters, according to the invention, in a hydraulic servo-control system with position, velocity and acceleration feedback.

FIG. 10 shows an application in which vibrations due to structural resonances, unbalance in the wheel 220, unbalance in the vehicle engine or other force variations are present in a servocontrol system. The system is an active vehicle suspension system. Vertical motion of the wheel relative to frame 221 is controlled by an actuator or hydraulic piston 222. Hydraulic oil flow to and pressure across the actuator are modulated by a servovalve 223 that is operated by an electrical signal 250 from a controller 224. The controller produces this output signal in response to comparing preselected control conditions to the vertical movement of the wheel 222 relative to the frame 221 of the vehicle. Vertical acceleration is measured by an accelerometer 225, vertical displacement is measured by a position transducer 226 and vertical velocity is measured by a velocity transducer 227. These three signals are connected to the controller 224 through separate filters 228A, 228P and 228V, respectively. Because of vibration present in the vehicle and road system, and the structure has resonant spring-mass components, both vibrations and resonances must be filtered for control purposes. The window tracking filters 228A, 228P and 228V will remove these effects without compromising the bandwidth of the primary servosystems, even though vibration and resonant frequencies are inside of the servosystem bandwidth. The result of application of these filters is that wide bandwidths are possible for controlling the servosystem.

Other applications where system resonances interfere with servosystem responses are positioning gimballed rocket engines for steering rockets, controlling airfoil surfaces on high performance aircraft, robotic positioners and numerically controlled (NC) machines.

Figure 11:
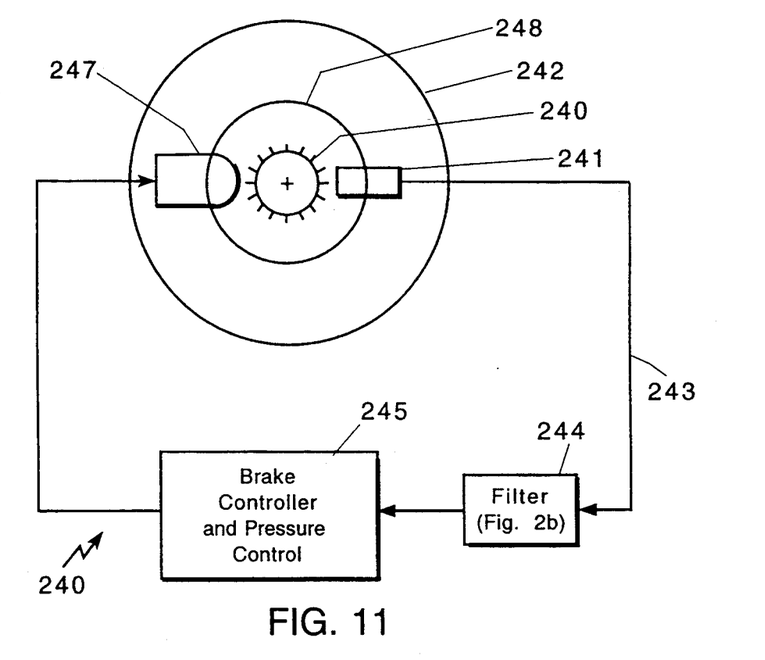
FIG. 11 is a schematic and block diagram of an anti-lock brake system (ABS) using window tracking filters incorporating the invention.

FIG. 11, an ABS or anti-lock braking system 240, is shown schematically. A wheel speed transducer or pickup 241 measures the rotational speed of the wheel 242. The wheel speed signal 243 is connected to the brake controller 245 and the pressure control system through filter 244. The controller 245 modulates the hydraulic brake pressure to operate the brake caliper 247 on disk rotor 248 in a manner that does not allow the wheel 242 to lock up, and thus develop the greatest vehicle stopping performance. Without the multi-window filter 244 of the present invention, vibration present in the vehicle, resonances in the vehicle, and force variations at the tire and road interface would disrupt the smooth and responsive performance of the ABS 240. The multi-window filters can also be used in traction control systems for vehicles. In these systems, both the vehicle acceleration and deceleration or braking, are controlled. Similar resonance and vibration conditions apply to both ABS and traction systems.

The embodiments which have been described herein are but some of the several which utilize this invention and are set forth here by way of illustration but not of limitation. It is apparent that many other embodiments which will be readily apparent to those skilled in the art may be made without departing materially from the spirit and scope of this invention.

What is claimed is:

1. In a control system having a source of control signals and an electrically controlled device coupled thereto, the improvement comprising a multi-window electrical filter connected between said source of electrical control signals and said electrically controlled device, comprising:
   a plurality of cascade connected filter stages, each said filter stage having an input and an output, with the input of said first stage being connected to said source of control signals and the output being connected to the input of the succeeding one of said filter stages,
   an operational amplifier having inverting and non-inverting inputs and a single output connected to said electrically controlled device, means connecting said inverting input to said single output and the output of the last of said filters to said non-inverting input of said operational amplifier, and
   threshold switch means sequentially bypassing each filter when the signal amplitude is equal to or greater than a level set by said threshold switch means, respectively.

2. The system defined in claim 1 wherein said threshold switch means are bidirectional.

3. A motorized wheelchair having a drive wheel, the control system defined in claim 1 or claim 2, including a joystick controller constituting said source control signals, and an electrical motor coupled to said drive wheel of said wheelchair constituting said controlled device.

4. In a control system having a source of control signals, a multi-window electrical filter for selectively filtering out unwanted portions of said control signal, including noise, ripple, oscillations and vibrations comprising:
   an operational amplifier having inverting and non-inverting inputs and a single output, said inverting input being electrically connected to said single output; and
   a plurality of series connected input stages including a first input stage and at least one subsequent input stage, each input stage having an input and an output, said input of said first input stage connected to said control signal, one of said at least one subsequent input stage being a last input stage, said output of said last input stage being electrically connected to said non-inverting input of said operational amplifier, each input of each subsequent input stage being electrically connected to said output of a preceding input stage, each input stage including (a) first means electrically connected between said input, and said output, of a respective input stage for filtering out unwanted frequencies of said signal while permitting desired frequencies of said signal to pass to said output of the respective input stage, and (b) second means electrically connected to said first means for providing a voltage threshold which permits said control signal having voltages with amplitudes that are less than said voltage threshold to pass through said second means and to said output of said respective input stage, and which permits passing of said signals, having voltages with amplitudes that are equal to or greater than said voltage threshold, through said second means and to said output of said respective input stage.

5. The multi-window electrical filter of claim 4 wherein said second means include at least a first diode and a second diode electrically connected in parallel, the cathode of said first diode being electrically connected to the anode of said second diode.

6. The multi-window electrical filter of claim 4 wherein said first means includes a resistor and capacitor connected in series and said second means comprises at least a first diode and a second diode electrically connected in parallel across said resistor, the cathode of said first diode being electrically connected to the anode of said second diode.

7. The multi-window electrical filter of claim 4 wherein said first means is a filter and said second means is a threshold device electrically connected in parallel to said filter.

8. The multi-window electrical filter of claim 4 wherein said first means of at least one input stage includes a first low pass filter and wherein said first means of at least one subsequent input stage includes a second low pass filter having a higher frequency than said first low pass filter, said second low pass filter being electrically connected between said first low pass filter and said non-inverting input of said amplifier.

9. In a motorized wheelchair control circuit which produces command signals to a first drive motor for a first wheel, and to a second drive motor for a second wheel, in response to output signals produced by at least one joystick controller, wherein the improvement comprises,
   first means electronically connected between said joystick controller and said first drive, motor and said second drive motor, respectively, for selectively filtering out unwanted portions of said output signals including noise, ripple, oscillations and vibrations, and further including:
   at least two operational amplifiers, each having an inverting and non-inverting input and a single output with its inverting input being electrically connected to its single output, and each single output being electronically connected to said first drive motor and to said second drive motor; and
   at least a first and a second plurality of series connected input stages, each of said plurality of series connected input stages including a first input stage and at least one subsequent input stage, each input stage having an input and an output, said input of said first input stage electronically connected to said output signals, one of said at least one subsequent input stage being a last input stage, said output of said last input stage being electrically connected to said non-inverting input of one of said at least two operational amplifiers, each input of each subsequent input stage being electrically connected to said output of a preceding input stage, each respective input stage including (a) second means electrically connected between said input, and said output, of said respective input stage for filtering out unwanted frequencies of said output signals while permitting desired frequencies of said output signals to pass through said second means to said output of said respective input stage, and (b) third means electrically connected to said second means for providing a voltage threshold which permits passage of said output signal, having voltages with amplitudes that are less than said voltage threshold through said second means and to said output of said respective input stage, and which permits current flow of said output signals, having voltages with amplitudes that are equal to or greater than said voltage threshold, through said third means and to said output of said respective input stage.

10. The motorized wheelchair control circuit of claim 9 wherein said first means includes an input of a first input stage of said first plurality of series connected input stages being electronically connected to a fore and aft output signal of said joystick controller, and (b) a second operational amplifier electrically connected to a second plurality of series connected input stages, a single output of said second operational amplifier electronically connected to said first drive motor and said second drive motor, and an input of a first input stage of said second plurality of series connected input stages being electronically connected to a left and right output signal of said joystick controller.

* * * * *